(12) United States Patent
Cheng et al.

(10) Patent No.: US 7,449,911 B2
(45) Date of Patent: Nov. 11, 2008

(54) METHOD FOR DETERMINING ELECTRO-MIGRATION FAILURE MODE

(75) Inventors: Yi-Lung Cheng, Danshuei Township (TW); Bi-Ling Liu, Hsin-Chu (TW); Chin-Chuang Peng, Hsin-Chu (TW); Chien-Shih Tsai, Hsin-Chu (TW); Hway-Chi Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 8 days.

(21) Appl. No.: 11/729,759

(22) Filed: Mar. 29, 2007

(65) Prior Publication Data

US 2008/0184805 A1 Aug. 7, 2008

Related U.S. Application Data

(60) Provisional application No. 60/899,588, filed on Feb. 5, 2007.

(51) Int. Cl.
*G01R 31/26* (2006.01)
(52) U.S. Cl. ....................................................... 324/765
(58) Field of Classification Search ................. 324/760, 324/765, 158.1, 713, 766, 537, 525, 527, 324/763; 714/728, 733, 731; 438/14, 17–18; 257/48
See application file for complete search history.

(56) References Cited

U.S. PATENT DOCUMENTS

| 5,612,627 | A | * | 3/1997 | Bui et al. | 324/766 |
| 6,919,639 | B2 | | 7/2005 | Ho et al. | |
| 7,132,684 | B2 | * | 11/2006 | Lee | 257/48 |

* cited by examiner

*Primary Examiner*—Ha Nguyen
*Assistant Examiner*—Tung X Nguyen
(74) *Attorney, Agent, or Firm*—Slater & Matsil, L.L.P.

(57) ABSTRACT

A method for testing integrated circuits includes forming a plurality of substantially identical first test structures, each comprising a first via structure connected to a first metal line, stress testing the plurality of first test structures to obtain a first plurality of failure times, and forming a plurality of substantially identical second test structures, each comprising a second via structure connected to a second metal line, wherein the second via structure has a substantially different reliability from the first via structure, and wherein the first metal line and the second metal line are substantially identical. The method further includes stress testing the plurality of second test structures to obtain a second plurality of failure times, and determining early failures of the plurality of first test structures and the plurality of second test structures.

16 Claims, 7 Drawing Sheets

METHOD FOR DETERMINING ELECTRO-MIGRATION FAILURE MODE

This application claims priority to provisional patent application Ser. No. 60/899,588, filed Feb. 5, 2007, and entitled "Method for Determining Electro-Migration Failure Mode," which application is incorporated herein by reference.

TECHNICAL FIELD

This invention is related generally to integrated circuits, and more particularly to the determination of the reliability of integrated circuits, and even more particularly to the determination of the reliability of interconnect structures.

BACKGROUND

In the semiconductor industry, when integrated circuits are fabricated, the expected reliability (for example, lifetime) needs to be determined and provided. This typically involves the determination of the reliability (or lifetime) of the interconnect structures, which include vias and metal lines.

As is known in the art, the reliability of interconnect structures is significantly affected by electro-migration, which is caused by the movement of atoms under the influence of flowing charges. The movement of atoms, in turn, causes voids in the interconnect structure, and, eventually, failure. Electro-migration is typically a long process that may take years. Therefore, the determination of reliability is performed by stressing samples under elevated temperatures and high currents to cause the failure of the samples. The expected reliability under normal operating conditions is then determined using empirical equations or models.

One of the commonly provided reliability data is the maximum allowable current density, which is typically defined as the current density that can flow through the interconnect structure if the integrated circuits are to have, for example, a ten year lifetime with less than 0.1 percent failure rate. To determine the maximum allowable current density, test structures as shown in FIG. 1 are formed and stressed until failure occurs. The data of failed samples are then plotted in a figure, for example, the one similar to FIG. 2, which illustrates cumulative failure as a function of failure time. Typically, the lifetime of test structures is limited by early failures, which mostly occur in vias. Intrinsic failures, which mostly occur in metal lines, are typically not a limiting factor of the lifetime of test structures. The maximum allowable current is then calculated based on the number and distribution of early failures.

FIG. 2 illustrates that samples with shorter lifetimes are shown to the left, which indicates early failures, while samples with longer lifetimes are shown to the right, which indicates intrinsic failures. FIG. 2, however, does not provide the dividing point between early failures and intrinsic failures. One of the methods used to determine early failures is to perform a scanning electron microscope (SEM) on each sample to determine the exact location of the failure in the samples. This method, however, is costly and time consuming. Another method is to determine the dividing portion by estimation. This method is quick but subjective. For example, a first person might think that line A is the dividing line, and points to the left of line A are early failure samples. A maximum allowable current density is thus calculated as 0.95 mA/cm$^2$. A second person and a third person, on the other hand, might think lines B and C are dividing lines, and, accordingly, the maximum allowable current densities are calculated as 0.64 mA/cm$^2$ and 0.43 mA/cm$^2$, respectively. Accordingly, a better method for determining the dividing line (point) is needed.

SUMMARY OF THE INVENTION

In accordance with one aspect of the present invention, a method of testing an integrated circuit includes forming a plurality of substantially identical first test structures, each comprising a first via structure connected to a first metal line, stress testing the plurality of first test structures to obtain a first plurality of failure times, and forming a plurality of substantially identical second test structures, each comprising a second via structure connected to a second metal line, wherein the second via structure has a substantially different reliability than the first via structure, and wherein the first metal line and the second metal line are substantially identical. The method further includes stress testing the plurality of second test structures to obtain a second plurality of failure times, and determining early failures of the plurality of first test structures and the plurality of second test structures.

In accordance with another aspect of the present invention, a method of analyzing integrated circuits includes forming a plurality of first test structures identical to each other wherein each of the first test structures comprises a first via structure connected to a first metal line, stress testing the plurality of first test structures to obtain a first plurality of failure times, plotting the first plurality of failure times on a plot illustrating accumulative failure rates as a function of failure time, and forming a plurality of second test structures identical to each other, wherein each of the second test structures comprises a second via structure connected to a second metal line, and wherein the second via structure has a substantially different cross-sectional area than the first via structure, and wherein the first metal line and the second metal line are substantially identical. The method further includes stress testing the plurality of second test structures to obtain a second plurality of failure times, plotting the second plurality of failure times on the plot, determining substantially overlapping portions of the first and the second plurality of failure times to determine a dividing point between intrinsic failures and early failures, and determining early failures of the plurality of first test structures, wherein the early failures have shorter failure times than the dividing point.

By determining the intrinsic failures, the early failures can be extracted. Thus, the reliability data can be determined with higher accuracy.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention provide a novel method for the determination of reliability in test structures. In the preferred embodiment, a plurality of test structures are formed and tested. Samples failing in early failure mode are extracted with improved accuracy. Based on the number and the distribution of early-failed samples, reliability data related to electro-migration may be determined. One of the reliability data of interest, the maximum allowable current density that can be applied to an integrated circuit and cause less than about 0.1 percent failure, may be determined.

Figure 1:
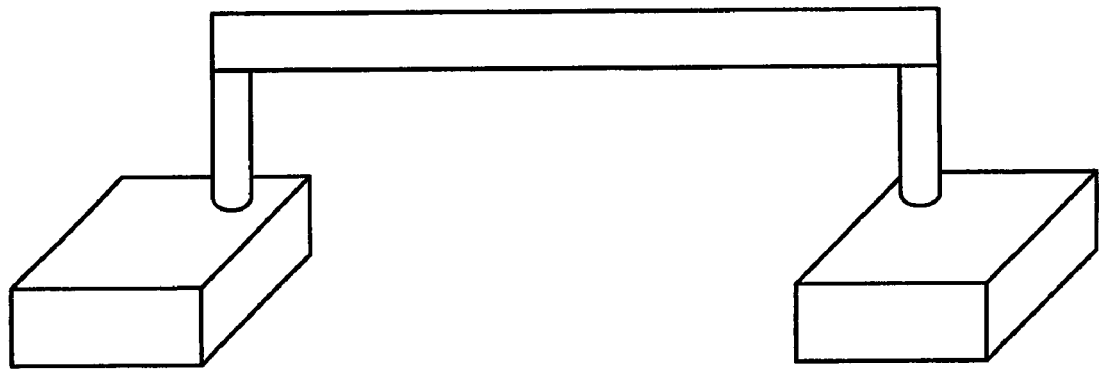
FIG. 1 illustrates a conventional test structure for determining the reliability of interconnect structures.
Figure 2:
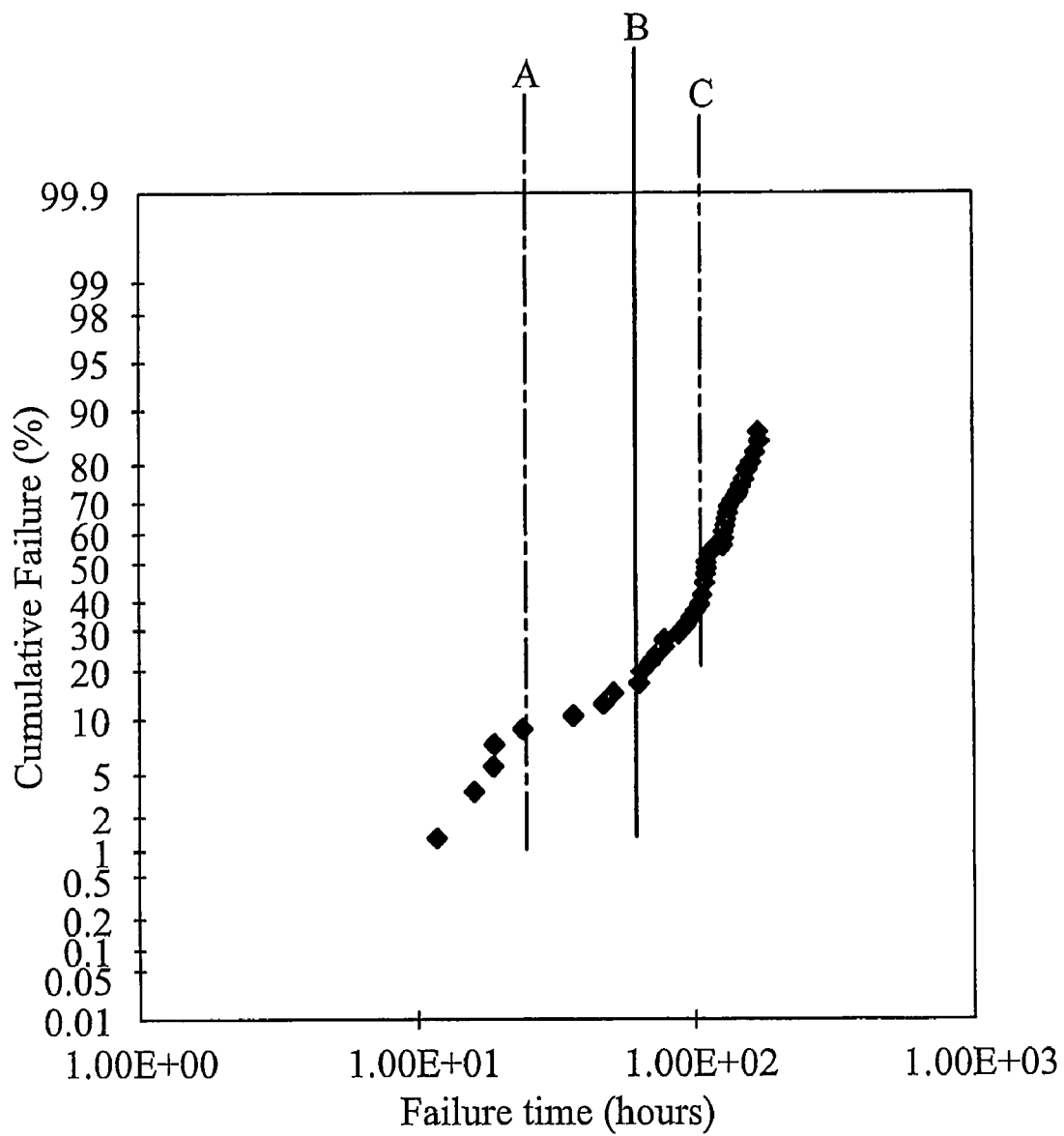
FIG. 2 is an exemplary plot used for determining the reliability of the interconnect structures shown in FIG. 1.
Figure 3:
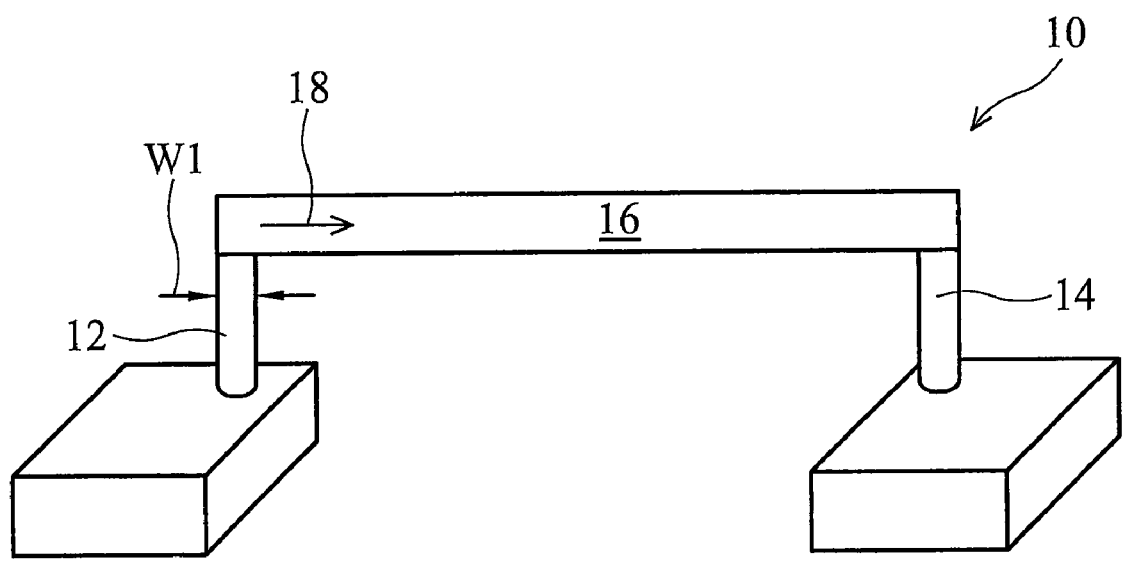
FIGS. 3 and 5 are preferred test structures for determining the reliability of interconnect structures.

In the preferred embodiment, as shown in FIG. 3, a plurality of first test structures 10 is formed. The first test structures 10 have a $V_x M_{x+1}$ structure, wherein $V_x$ indicates a via in metallization layer x, and $M_{x+1}$ indicates a metal line in the metallization layer immediately over $V_x$. Each of the test structures 10 includes a via 12, a via 14 and a metal line 16 connecting vias 12 and 14. A current is applied to stress each of the test structures 10 until each fails. The stress is preferably preformed at elevated temperatures. The electron direction, which is the opposite of the current direction, is shown as arrow 18. As is known in the art, with the electron direction as shown with arrow 18, failure will occur in via 12 but not via 14 since the flow of electrons will impact atoms in via 12 in the direction of via 14.

Test structures 10 preferably resemble the real structure used in integrated circuits whose reliability data (for example, maximum allowable current) are to be determined. The number of test structures 10 is preferably greater than about 100, and more preferably between about 100 and 100,000. Stressing test structures 10 eventually causes their failure, and the time-to-failure of the test structures 10 is plotted in FIG. 4 as diamonds, wherein FIG. 4 illustrates the accumulative failure of samples as a function of failure time.

Figure 4:
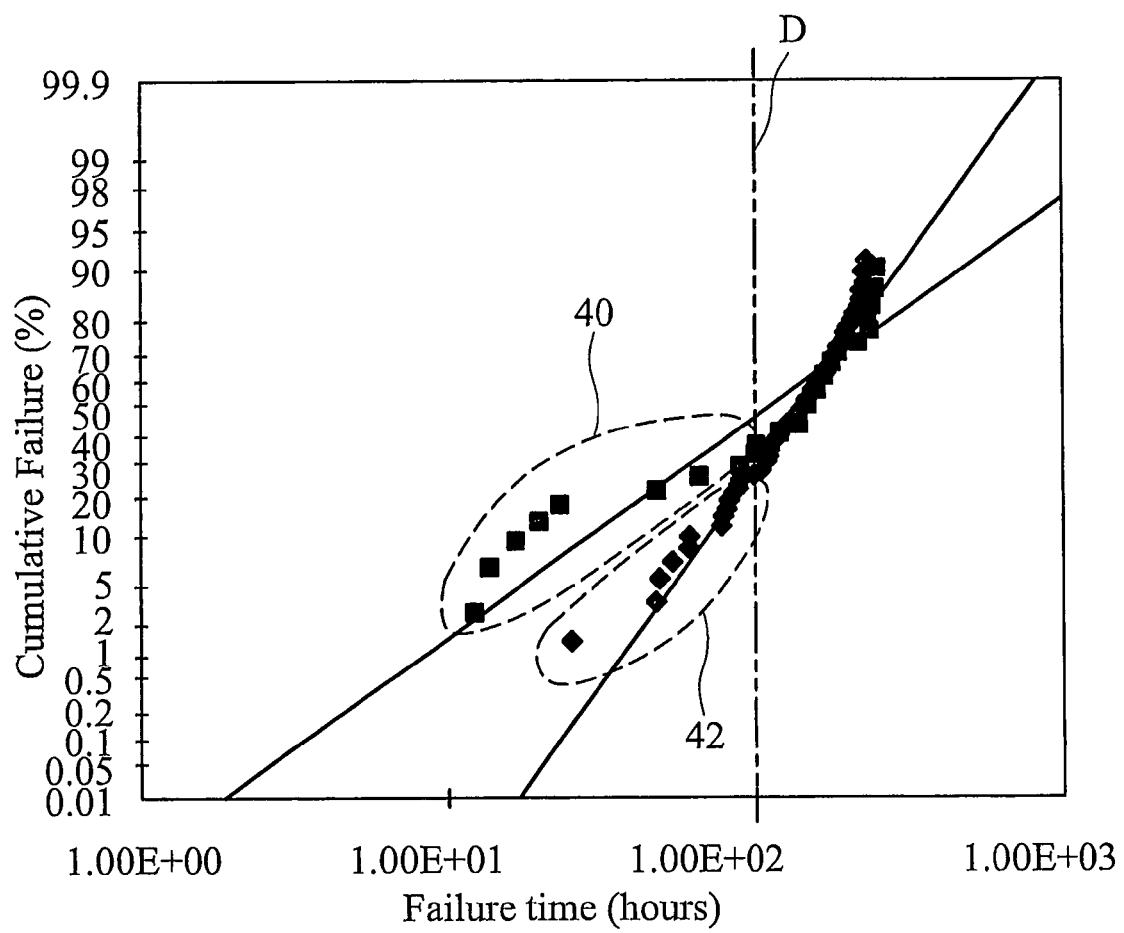
FIG. 4 is an exemplary plot used for determining the reliability of the interconnect structures.
Figure 5:
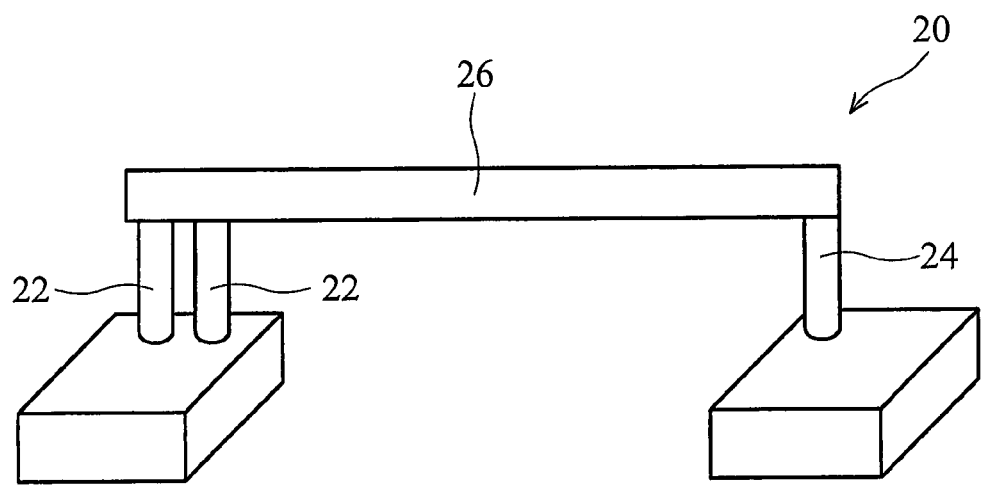

Referring to FIG. 5, a plurality of second test structures 20 is formed. The second test structures 20 also have a $V_x M_{x+1}$ structure. Each of the test structures 20 includes a via structure 22, a via 24 and a metal line 26 connecting via structure 22 and via 24. Via structure 22 includes at least two vias with the total cross-sectional area substantially greater than that of via 12 in FIG. 3. Metal line 26 is preferably identical to metal line 16. Each of the vias in via structure 22 may have a same or different size as those in via 12. Current is then applied to stress test structures 20, preferably at elevated temperatures. The failure times of each test structure 20 are plotted in FIG. 4 as squares.

Early failures are typically related to the failure of vias, while intrinsic failures (with longer failure time than early failures) are typically related to the failure of metal lines. Metal lines may have early failures too. Experience, however, has revealed that the likelihood of early failures occurring in metal lines is very low. For example, the number of early failures in metal lines tends to be less than about one percent of the number of intrinsic failures. Therefore, it may be concluded with reasonable confidence that if failures occurring in metal lines can be distinguished from failures occurring in vias, early failures can be determined. Since metal line 16 in FIG. 3 is identical to metal line 26 in FIG. 5, it is expected that statistically, intrinsic failures in test structures 10 will have a similar number and distribution (with regard to failure time) as intrinsic failures in test structures 20. Accordingly, intrinsic failure data of test structures 10 will substantially overlap the data of test structures 20 in FIG. 4.

Referring to FIG. 4, it is noted that if a line D as shown is drawn, squares and diamonds on the right of line D substantially overlap, while squares and diamonds on the left of line D are substantially distinct. Therefore, it is derived that squares and diamonds on the right of line D represent intrinsic failures, while squares and diamonds on the left of line D represent early failures. Squares in dotted region 40 are early failures of test structures 10, which resemble the real structure of an integrated circuit. These early failures can then be used for the determination of reliability data such as the maximum allowable current density.

In the exemplary embodiment as shown in FIG. 4, squares in dotted region 40 and diamonds in dotted region 42 are substantially distinguished, so that the overlap portions can be identified substantially accurately. If, however, the reliability data of via 12 in FIG. 3 and via structure 22 in FIG. 5 do not have an adequate difference, squares and diamonds may substantially overlap across the entire range in FIG. 4, and the dividing line D cannot be correctly drawn, thus the accuracy of the reliability data is also affected. Preferably, the reliabilities of via 12 and via structure 22 are substantially different. In an exemplary embodiment, the lifetime of via structure 22 is greater than about 130 percent, and more preferably greater than about 160 percent, of the lifetime of via 12, so that the squares and diamonds can be adequately distinct.

Figure 6:
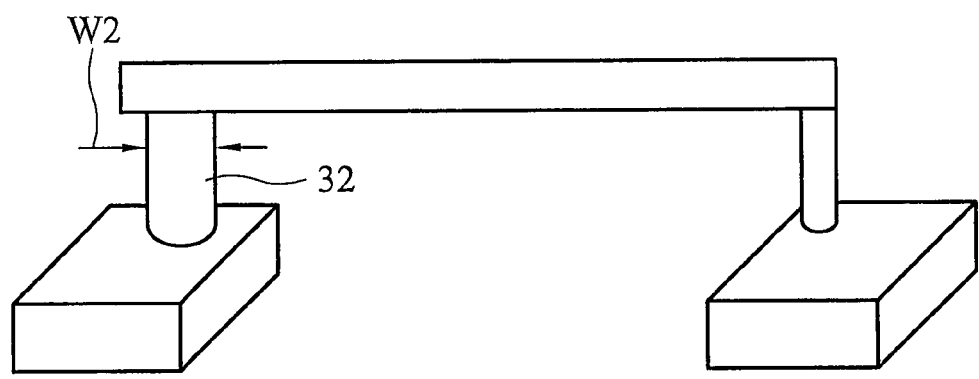
FIGS. 6 and 7 are variations of the preferred test structure embodiment.

Preferably, other via structures that can cause a distinction like the distinction between squares and diamonds can also be used. FIG. 6 illustrates an alternative embodiment, wherein via structure 32 includes a single via with a greater cross-sectional area than via 12 in FIG. 3. Via structure 22 preferably has a width W2 greater than 1.5 times the width W1 (refer to FIG. 3) of via 12. The resulting cross-sectional area will be greater than about 2.25 times the cross-sectional area of via 12.

Figure 7:
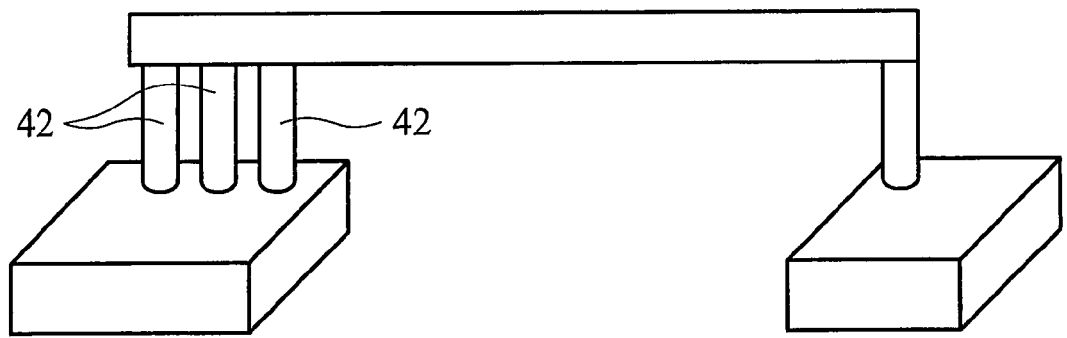

In other embodiments, as shown in FIG. 7, via structure 42 includes three vias. If necessary, more vias can be formed. The preferred number of vias and/or the width of the via(s) may be determined based on how clear the distinction of squares and diamonds is, and the number of vias and/or the width of these via(s) may be increased if the distinction is not enough for the determination of early failures.

In yet other embodiments, via structures may have a substantially smaller cross-sectional area than via 12 in FIG. 3, and this will cause the reliability of the corresponding test structures to be worse than test structures 10. However, for the same reason discussed in preceding paragraphs, the intrinsic portions of test structures 10 and test structures with smaller cross-sectional areas will still substantially overlap, and thus early failures of test structures 10 can be identified.

In yet other embodiments, via structures may be formed using a different material from via 12, and thus have a different reliability. Accordingly, early failure data for via 12 can be extracted. Via 12 and via structure 22 may have a same or a different structure/dimension.

In yet other embodiments, a plurality of third test structures having vias with substantially different reliabilities than via 12 and via structure 22 are formed and stress tested. The resulting failure times (not shown) can also be plotted in FIG. 4. With three groups of failure time data, intrinsic failure times can be better determined.

Figure 8:
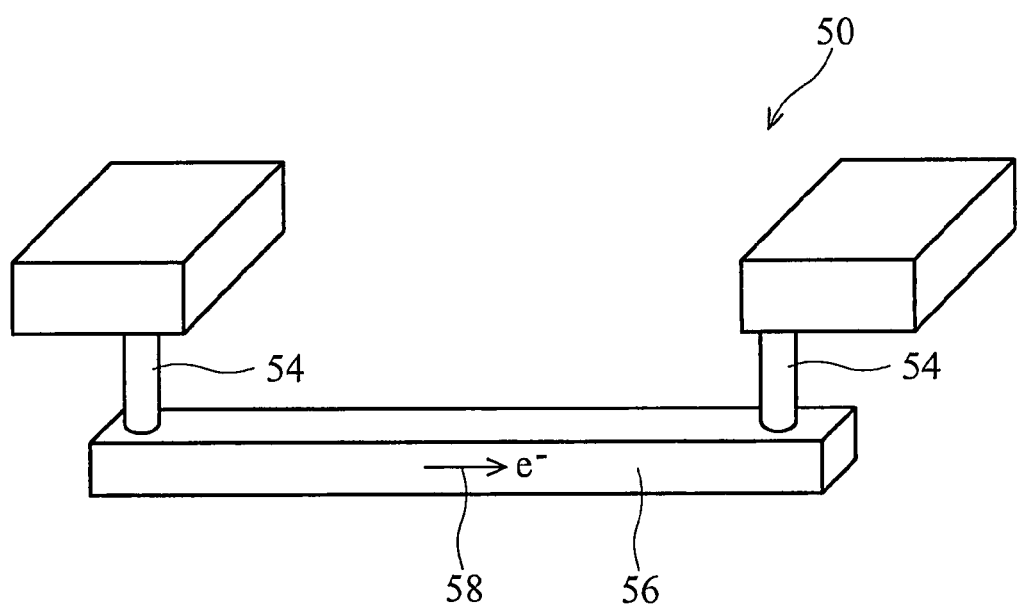
FIGS. 8 and 9 illustrate test structures having $V_xM_x$ structures.
Figure 9:
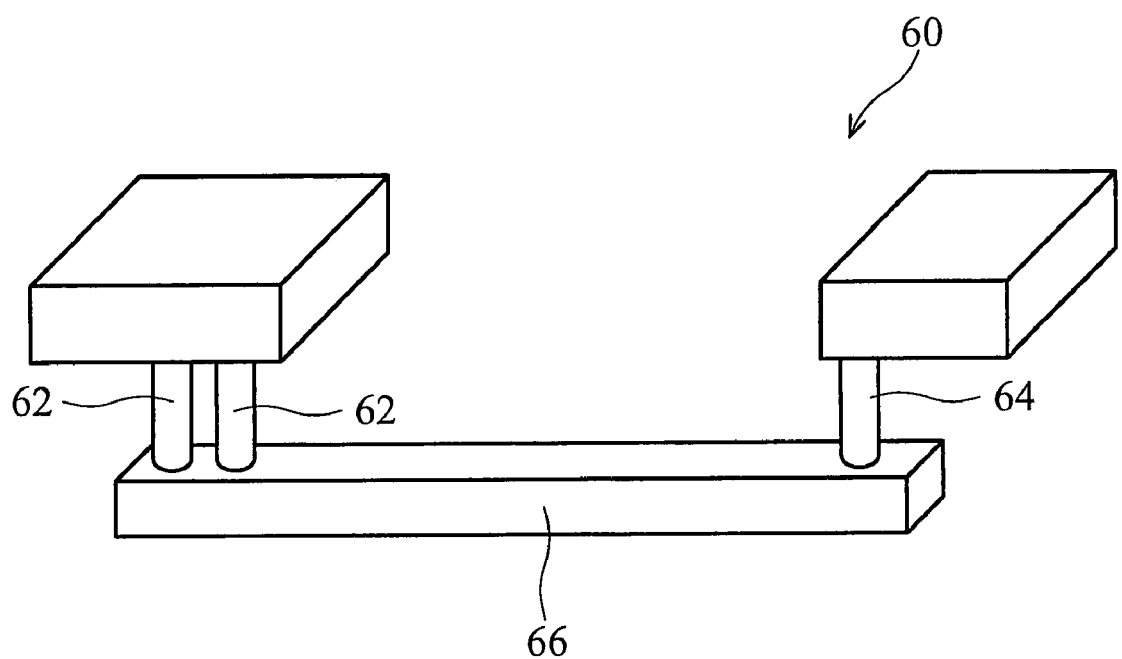

In the embodiments discussed in the preceding paragraphs, $V_xM_{x+1}$ structures are formed and tested. In other embodiments, $V_xM_x$ structures, which are illustrated in FIGS. 8 and 9, may be formed. In FIG. 8, a test structure 50 is formed. Vias 52 and 54 are interconnected by a metal line 56. With electrons flowing in the direction of arrow 58, via 52 is subject to early failure. In FIG. 9, a test structure 60 is formed, which includes a via structure 62 with two vias and a via 64 interconnected by a metal line 66. By stressing a plurality of test structures 50 and 60, a plot as shown in FIG. 4 may be obtained, and reliability data is determined. The data obtained from $V_xM_{x+1}$ and $V_xM_x$ structures may not be the same, and the worst one may be selected.

In the embodiments discussed in preceding paragraphs, the early failures are extracted using plots. One skilled in the art will realize that the same results can be obtained using other methods, for example, by calculating a fitting line for each test structure, and determining deviations of the fitting line.

The preferred embodiments of the present invention have several advantageous features. No time-consuming failure analysis is needed for determining electro-migration performance of integrated circuits. The accuracy for reliability determination is thus improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of testing an integrated circuit, the method comprising:
   forming a plurality of substantially identical first test structures, each comprising a first via structure connected to a first metal line;
   stress testing the plurality of first test structures to obtain a first plurality of failure times;
   forming a plurality of substantially identical second test structures, each comprising a second via structure connected to a second metal line, wherein the second via structure has a substantially different reliability from the first via structure, and wherein the first metal line and the second metal line are substantially identical;
   stress testing the plurality of second test structures to obtain a second plurality of failure times; and
   determining early failures of the plurality of first test structures and the plurality of second test structures.

2. The method of claim 1, wherein the step of determining early failures comprises:
   plotting the first plurality of failure times and the second plurality of failure times in a same plot;
   identifying substantially overlapping portions of the first and the second plurality of failure times from the plot to determine intrinsic failures; and
   identifying early failures by excluding the intrinsic failures.

3. The method of claim 1, wherein the first via structure comprises only one via and the second via structure comprises two vias.

4. The method of claim 3, wherein the two vias in the second via structure each has a different width from the via in the first via structure.

5. The method of claim 3, wherein the first via structure comprises only one via and the second via structure comprises three vias.

6. The method of claim 1, wherein the first and the second via structures comprise different materials.

7. The method of claim 1, wherein the second via structure comprises a via having a width greater than 1.5 times a width of a via in the first via structure.

8. The method of claim 1, wherein the second via structure has a cross-sectional area substantially smaller than a cross-sectional area of the first via structure.

9. The method of claim 1, wherein the first metal line overlies the first via structure and the second metal line overlies the second via structure.

10. The method of claim 1, wherein the first metal line underlies the first via structure and the second metal line underlies the second via structure.

11. A method for analyzing integrated circuits, the method comprising:
    forming a plurality of first test structures identical to each other, wherein each of the first test structures comprises a first via structure connected to a first metal line;
    stress testing the plurality of first test structures to obtain a first plurality of failure times;
    plotting the first plurality of failure times on a plot illustrating accumulative failure rates as a function of failure time;
    forming a plurality of second test structures identical to each other, wherein each of the second test structures comprises a second via structure connected to a second metal line, and wherein the second via structure has a substantially different cross-sectional area from the first via structure, and wherein the first metal line and the second metal line are substantially identical;
    stress testing the plurality of second test structures to obtain a second plurality of failure times;
    plotting the second plurality of failure times on the plot;
    determining substantially overlapping portions of the first and the second plurality of failure times to determine a dividing point between intrinsic failures and early failures; and
    determining early failures of the plurality of first test structures, wherein the early failures have shorter failure times than the dividing point.

12. The method of claim 11, wherein the second via structure comprises two vias, each being identical to the first via.

13. The method of claim 11, wherein the second via structure comprises two vias, each having a different width from the first via.

14. The method of claim 11, wherein a via in the second via structure comprises a single via having a width greater than about 1.5 times a width of a via in the first via structure.

15. The method of claim 11, wherein the first and the second via structures comprise different materials.

16. The method of claim 11 further comprising:
    forming a plurality of third test structures identical to each other, wherein each of the third test structures comprises a third via structure connected to a third metal line, and wherein the third via structure has a substantially different cross-sectional area than the first via structure and the second via structure, and wherein the first metal line and the third metal line are substantially identical;

stress testing the plurality of third test structures to obtain a third plurality of failure times; and plotting the third plurality of failure times on the plot, wherein the third plurality of failure times is used for determining the dividing point.

* * * * *